(12) United States Patent
Venkataraghavan et al.

(10) Patent No.: US 7,997,145 B2
(45) Date of Patent: Aug. 16, 2011

(54) SYSTEM FOR PRELOADING PIEZOELECTRIC ACTUATORS AND METHOD

(75) Inventors: Jayaraman Venkataraghavan, Dunlap, IL (US); William Love, Dunlap, IL (US); Stephen R. Lewis, Chillicothe, IL (US); Zhenlong Xu, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 12/786,575

(22) Filed: May 25, 2010

(65) Prior Publication Data

US 2010/0275423 A1 Nov. 4, 2010

Related U.S. Application Data

(62) Division of application No. 11/998,531, filed on Nov. 30, 2007, now Pat. No. 7,765,877.

(51) Int. Cl.
*G01B 7/16* (2006.01)
(52) U.S. Cl. ............................................. 73/777; 73/760
(58) Field of Classification Search ............ 73/760–777; 310/328
See application file for complete search history.

(56) References Cited

U.S. PATENT DOCUMENTS

| | | | |
|---|---|---|---|
| 4,310,269 A * | 1/1982 | Neu et al. ........................ | 408/11 |
| 4,438,364 A | 3/1984 | Morison | |
| 5,239,223 A | 8/1993 | Miyoshi | |
| 5,301,558 A | 4/1994 | Livingston et al. | |
| 5,501,111 A | 3/1996 | Sonderegger et al. | |
| 5,777,239 A | 7/1998 | Fuglewicz | |
| 6,034,296 A | 3/2000 | Elvin et al. | |
| 6,279,395 B1 | 8/2001 | Insalaco et al. | |
| 6,349,705 B1 | 2/2002 | Pirkl et al. | |
| 6,366,868 B2 | 4/2002 | Freudenberg et al. | |
| 6,556,028 B1 | 4/2003 | Umanskiy et al. | |
| 6,715,336 B1 | 4/2004 | Xu | |
| 6,853,201 B2 | 2/2005 | Him et al. | |
| 6,971,172 B2 * | 12/2005 | Crofts ....................... | 29/890.125 |
| 6,998,761 B1 | 2/2006 | Frank et al. | |
| 7,055,796 B2 * | 6/2006 | Voss .......................... | 251/129.06 |
| 7,149,635 B2 | 12/2006 | Cosentino et al. | |
| 7,222,424 B2 | 5/2007 | Jovovic et al. | |
| 7,333,179 B2 * | 2/2008 | Yuan et al. ...................... | 355/72 |
| 7,355,519 B2 | 4/2008 | Grold et al. | |
| 7,410,039 B2 | 8/2008 | Ore et al. | |

FOREIGN PATENT DOCUMENTS

| | | |
|---|---|---|
| DE | 10041333 | 3/2002 |
| WO | 99/08330 | 2/1999 |

* cited by examiner

*Primary Examiner* — Max Noori
(74) *Attorney, Agent, or Firm* — Liell & McNeil

(57) ABSTRACT

A system for preloading piezoelectric actuators includes a fixture, a preloading mechanism configured to apply a mechanical force to a piezoelectric element supported by the fixture, and a sensor configured to sense an electrical property induced by the mechanical force in an electrical circuit having the piezoelectric element therein. A control device is coupled with the sensor and configured to generate a signal based on the sensed electrical property. A method of setting or testing preload includes applying a mechanical force to a piezoelectric element, and correlating an electrical property induced by the mechanical force with a magnitude of the mechanical force. Closed loop control allows preload to be set highly accurately.

5 Claims, 3 Drawing Sheets

SYSTEM FOR PRELOADING PIEZOELECTRIC ACTUATORS AND METHOD

RELATED APPLICATIONS

This application is a divisional application of U.S. patent application Ser. No. 11/998,531, filed on Nov. 30, 2007, to SYSTEM FOR PRELOADING PIEZOELECTRIC ACTUATORS AND METHOD, the entire contents of which are hereby incorporated by reference.

TECHNICAL FIELD

The present disclosure relates generally to preloading piezoelectric devices, and relates more particularly to sensing an electrical property of a piezoelectric element, which is correlated with mechanical force applied thereto.

BACKGROUND

Piezoelectric devices are used in a wide variety of applications, notably as actuators and sensors. In general terms, when an electrical potential is applied to piezoelectric material, the material undergoes a conformational change. This phenomenon is leveraged in a piezoelectric actuator to enable electronic control over the position of a component coupled with a piezoelectric element of the actuator. One common application for piezoelectric actuators is in the fuel injection arts, wherein piezoelectric actuators are used to control the position of a valve. Piezoelectric actuators offer a variety of advantages over other known actuator systems. For example, piezoelectric actuators tend to be relatively easy to precisely and accurately control, and are typically relatively robust. In the context of fuel injectors, piezoelectric actuators may be required to actuate millions or even billions of times over the course of a fuel injector's service life.

A downside to piezoelectric actuators relates to the relative precision typically desirable in preloading the piezoelectric elements used therein. In other words, a particular mechanical bias is usually required to enable a piezoelectric element to reliably and appropriately change its conformation in response to an electrical potential. Piezoelectric materials, such as certain crystalline and ceramic materials, will typically exist in a low energy state when no preload and no electrical potential is applied thereto. Application of an electrical potential to a piezoelectric element which is not sufficiently preloaded can cause it to break. Conversely, where piezoelectric elements are excessively preloaded, they may not be able to successfully actuate when an electrical potential is applied thereto. Improper preloading can also reduce the service life of the piezoelectric element. Engineers have heretofore found it relatively difficult to set piezoelectric element preloads at just the right level.

One attempt at preloading piezoelectric actuators is known from U.S. Pat. No. 6,998,761 B1 to Frank et al. In the strategy described by Frank et al., a piezoelectric actuator is pressed into a hollow body with a defined force by an assembly device to elongate the hollow body. The defined force purportedly corresponds to desired prestress of the actuator. While maintaining the force, a cover plate is welded to the hollow body to fix the prestress of the actuator. While potentially applicable in certain instances, the approach of Frank et al. is unlikely to achieve sufficiently precise preloads to provide optimum actuator performance and durability. The purported "defined force" applied by a mechanized force device will tend to be inherently variable. In particular, tolerance issues with regard to the mechanized force device, as well as tolerance issues relating to the actuator itself may result in actuators being improperly prestressed.

SUMMARY

In one aspect, a method of preparing a piezoelectrically actuated device for service includes the steps of applying a mechanical force to a piezoelectric element of a piezoelectric actuator for the piezoelectrically actuated device, and sensing an electrical property induced by the mechanical force in an electrical circuit that includes the piezoelectric element. The method further includes the steps of generating a signal corresponding to the sensed electrical property, and setting a preload on the piezoelectric element in a manner which is responsive to the signal.

In another aspect, a system for preloading piezoelectrically actuated devices includes a fixture configured to support a piezoelectrically actuated device having an electrical circuit with a piezoelectric element disposed therein and a preloading mechanism configured to apply a mechanical force to the piezoelectric element when the piezoelectrically actuated device is supported by the fixture. The system further includes a sensor configured to sense an electrical property induced by the mechanical force in the electrical circuit and output a signal corresponding therewith, and a control device coupled with the sensor and configured to adjust the preloading mechanism to set a preload on the piezoelectric element at a target preload based at least in part on the signal.

In still another aspect, a method for setting or testing preload in piezoelectrically actuated devices includes the steps of applying a mechanical force to a piezoelectric element of a piezoelectrically actuated device, sensing an electrical property induced by the mechanical force in an electrical circuit that includes the piezoelectric element and correlating the sensed electrical property with a magnitude of the mechanical force

DETAILED DESCRIPTION

Figure 1:
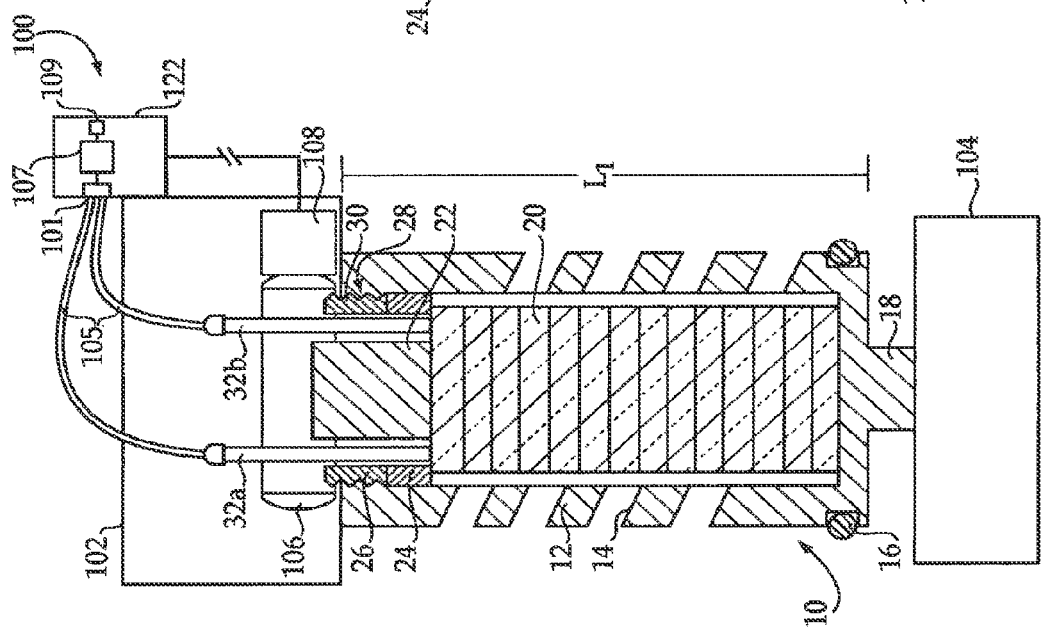
FIG. 1 is a schematic illustration of a system for preloading piezoelectric actuators, according to one embodiment.

Referring to FIG. 1, there is shown a system 100 for preloading piezoelectric actuators, having an actuator subassembly 10 positioned therein. System 100 comprises a fixture having a first fixture component 102 and a second fixture component 104 which are configured to support subassembly 10 therein for preloading, as further described herein. It should be appreciated that the configuration of system 100 which is shown in FIG. 1 is purely illustrative, and other embodiments departing in various ways from the illustrated system will fall within the scope of the present disclosure.

Likewise, the illustration of subassembly 10 which is shown in FIG. 1 is also exemplary, and other piezoelectrically actuated devices and subcomponents thereof may be preloaded, tested, prepared for service, etc., without departing from the present disclosure. In the embodiment shown, subassembly 10 includes a piezoelectric element 20, such as a piezoelectric stack, of multiple discs, and a spring 12 within which element 20 is at least partially positioned.

In one embodiment, spring 12 may include a movable contact element comprising a contact button 18 formed integrally therewith which is configured for contacting a component whose position is to be adjusted with element 20. A fluid seal such as an O-ring 16 may be fitted onto spring 12 for fluidly sealing with an outer casing, which is not shown in FIG. 1. System 100 may further include a preloading mechanism, such as a rotary force producing device 106 configured to apply a mechanical force to element 20 when supported with fixture components 102 and 104. System 100 may further include a sensor 101, and a control device such as an electronic control unit 107 coupled therewith and housed within a control module 122 or the like. Subassembly 10 may further include a first electrical terminal 32a and a second electrical terminal 32b which are coupled with element 20 and configured to provide an electrical potential, a voltage potential, across element 20 for actuating the same in a known manner. In the embodiment shown, when a voltage is applied to element 20 it will tend to elongate in a reciprocation direction to move contact button 18 away from electrical terminals 32a and 32b. Spring 12 is typically positioned about element 20, and hence actuation of element 20 will tend to elongate spring 12, moving contact button 18 against a spring force or bias of spring 12.

It is typically desirable to apply a prescribed preloading force to piezoelectric element 20 for proper operation as an actuator. The volume, width, length, materials, service application, number of discs, and other factors can all bear on the magnitude of the prescribed preload. For purposes of preloading element 20, force producing device 106 may be used to apply a mechanical force to element 20 which induces an electrical property in element 20. The induced electrical property may be correlated with a magnitude of the applied mechanical force, as further described herein. Thus, by monitoring the induced electrical property it may be determined when an appropriate mechanical force, having a magnitude equal to a target preload is applied to element 20. While setting preload during actuator assembly is one practical application of the present disclosure, the teachings set forth herein might also be used to test assembled actuators to determine if they are appropriately preloaded, as further described herein.

Determining that a proper preload is applied to element 20 may be achieved in one embodiment by sensing the induced electrical property with sensor 101, which generates signals corresponding to the sensed electrical property. Setting preload on element 20 may take place in a manner which is responsive to signals from sensor 101, as will be apparent from the following description. In particular, sensor 101 may be coupled with terminals 32a and 32b via electrical connector lines 105, forming an electrical circuit which includes piezoelectric element 20. The sensed electrical property may be voltage, or some other parameter indicative of or associated with voltage. In one embodiment, capacitance or a change in capacitance of the electrical circuit which includes element 20 may be measured, and a voltage change deduced from the sensed change in capacitance. In other words, capacitance might be sensed prior to applying mechanical force with device 106, then again while mechanical force is being applied. A difference between the capacitance prior to and after applying mechanical force can be used to deduce the change in voltage in the subject circuit, which is in turn correlated with the mechanical force and hence preload. In general, a larger change in capacitance will mean a larger change in voltage, which is in turn correlated with a greater application of mechanical force with device 106. Electronic control unit 107 may receive the aforementioned signals from sensor 101 and output adjustment commands to actuator 108 to adjust the mechanical force toward a target preload force. In this manner, the mechanical force applied to element 20 may be varied until the sensed electrical property indicates that a target preload force is applied to element 20.

While a variety of preloading mechanisms such as force producing device 106 may be used in the context of the present disclosure, in one embodiment force producing device 106 may comprise a rotary force producing device which couples with and rotates a nut 26 or other threaded member, which is coupled with spring 12. In one embodiment, nut 26 may comprise external threads 28 which mate with internal threads 30 of spring 12. A spacer 24, for instance an annular spacer, may be positioned between nut 26 and piezoelectric element 20. Threaded engagement and relative rotation between nut 26 and spring 12 can increase or decrease a length of spring 12 to increase or decrease a mechanical force applied to element 20 via spacer 24. In the illustrated embodiment, rotation of nut 26 in a first direction will cause spring 12 to expand or lengthen, increasing preload, whereas rotation of nut 26 in a second direction will have an opposite effect, allowing spring 12 to shorten and decreasing preload. Setting preload on element 20 may thus include adjusting spring 12 from a first tension state corresponding to a first preload to a second, greater tension state corresponding to a second preload. Where used with other spring configurations, adjusting preload may be effected by increasing or decreasing a compression state of a spring rather than a tension state.

In one embodiment, electronic control unit 107 may be configured via a closed loop preloading routine to output adjustment commands to a preloading mechanism such as force producing device 106 and actuator 108 to adjust the mechanical force on element 20 toward a target preload force in response to signals from sensor 101. Accordingly, control module 122 may include a memory 109 having program instructions recorded thereon for preloading actuators, subassemblies, or assembled devices, having piezoelectric elements and supported via fixture components 102 and 104. Rather than or in addition to an automated preloading routine, control module 122 could include a display and operator controls such that an operator could manually increase, decrease or leave alone a preload on element 20.

Adjustment commands, or signals, may be generated, for example, by comparing a value of a signal from sensor 101 with a target value via electronic control unit 107, and outputting commands from electronic control unit 107 based on a difference between the respective values. The target value may be a signal value corresponding to an electrical property in the electrical circuit including element 20 which indicates that element 20 is properly preloaded. The electrical property may be voltage, capacitance, change in voltage or capacitance, etc., as described herein.

The subject target value may be a target value which is specific to piezoelectric element 20. In other words, given a plurality of piezoelectric elements, each may have a unique electrical property, such as change in capacitance, which is induced by a given mechanical force. For example, a force of a particular magnitude can induce slightly differing electrical properties in ostensibly identical piezoelectric elements. Thus, a preload of 850 Newtons, a common target preload, applied separately to a plurality of identical piezoelectric elements, may be expected to induce differing changes in capacitance in electrical circuits associated one with each of the piezoelectric elements. The present disclosure leverages this natural variability to enable a means of setting preload which is more accurate and precise than earlier strategies, such as Frank et al. discussed above.

Figure 6:
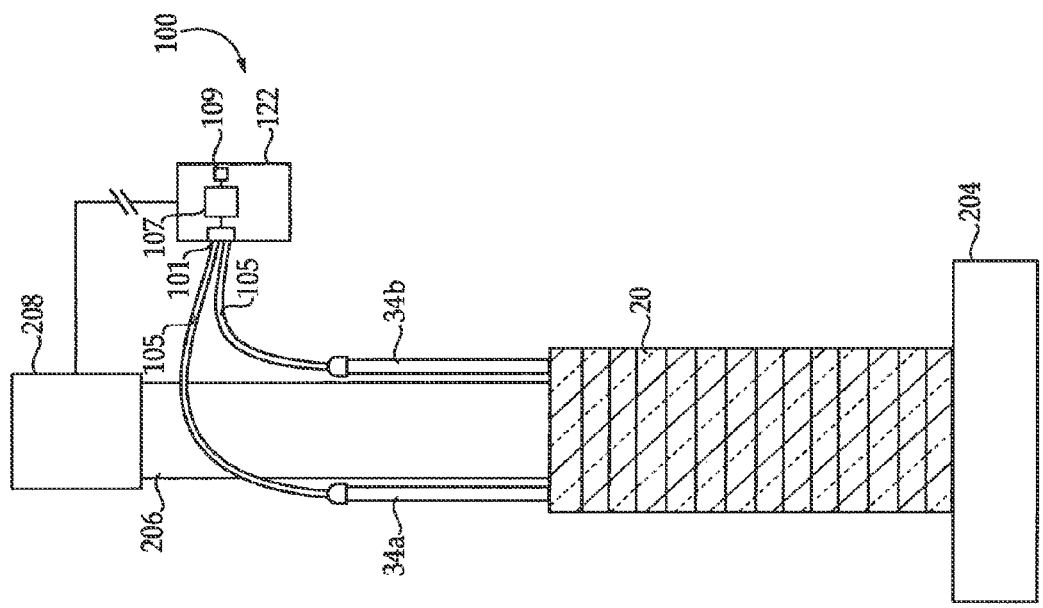
FIG. 6 is a schematic illustration of another part of the system shown in FIG. 1.

In one embodiment, system 100 or another system may be used to establish a target value for a particular piezoelectric element prior to preload setting on that piezoelectric element with system 100. The target value which is established may then be assigned to the particular piezoelectric element and recorded in memory 109. Referring to FIG. 6, there are shown additional elements of system 100 in a configuration which may be used for establishing the target value for piezoelectric element 20. Numerals alike to those used in FIG. 1 are used in FIG. 6 to denote similar or identical components, as certain of the components of system 100 shown in FIG. 1 might also be used in establishing the target value. In other embodiments the system for establishing the target value for use in setting preload on piezoelectric elements might be separate from system 100. To establish the subject target value, piezoelectric element 20 may be supported via a fixture component 204. Element 20 may then be compressed via a mechanical force applied by a second force producing device 206, for example a linear force producing device. A force measuring device such as a meter 208 or the like may be coupled with force producing device 206 such that the mechanical force applied to piezoelectric element 20 with device 206 will have a magnitude equal to a target preload for piezoelectric element 20. Device 208 may be in communication with control module 122. When the prescribed force is applied to element 20, an electrical property induced thereby may be sensed via sensor 101. Sensor 101 may output signals corresponding to the sensed electrical property, such as a change in capacitance, and a signal value recorded in memory 109 via electronic control unit 107 which corresponds with the sensed electrical property. Certain piezoelectric elements are properly preloaded when about 850 N of linear preloading force is applied, and accordingly a change in capacitance indicating application of 850 N of force to element 20 can serve as a standard, or target value, for subsequent setting of the preload of element 20 with system 100, prior to placing the corresponding actuator in service.

Returning to FIG. 1, after sensing the electrical property with sensor 101, communicating a signal to electronic control unit 107, and then comparing a value of the signal with the target value, electronic control unit 107 may output an adjustment command based at least in part on the comparison. Adjustment commands might take the form of angular displacement commands for device 106. It will be recalled that rotating nut 26 can vary a spring force of spring 12 applied to element 20, hence changing the angular displacement of nut 26 will vary the preload on element 20. Another type of command might also be used in other embodiments. For instance, where a linear force producing device such as a press is used instead of device 106, linear adjustment commands might be used. In response to an adjustment command, device 106 may be actuated to increase or decrease mechanical force on element 20. The electrical property in the subject electrical circuit may then be sensed a second time, a second signal generated with sensor 101, and the value of the second signal corresponding with the electrical property may then be compared with the target value. Confirming the mechanical force applied to element 20 is equal to target preload may take place when the second signal, or a subsequent signal, is equal to the target value. Once properly preloaded, processing with system 100 may conclude with setting the preload at the target preload by locking nut 26 at its present angular orientation.

In still further embodiments, system 100 may be used to diagnose structural flaws or other problems with subassembly 10, rather than or in addition to setting or adjusting a preload on the associated piezoelectric element 20. For example, it is contemplated that piezoelectric elements having cracks or other problems may have electrical properties induced by a mechanical force thereon which vary substantially from expected properties. Where an electrical property sensed via sensor 101 differs from an expected property by a certain degree, for example more than one or two standard deviations from an average sensed property for a plurality of similar piezoelectric elements, the associated subassembly might be discarded or flagged for further testing or service. Results which are substantially different from what is expected could also indicate problems with system 100.

It will further be noted that rotation of nut 26 relative to spring 12 may have a tendency to adjust a relative position therebetween, as rotating nut 26 in a first direction will tend to draw nut 26 deeper into spring 12, whereas rotation in an opposite direction will tend to extract nut 26 from spring 12. In other embodiments, nut 26 need not threadedly engage with spring 12 but could engage with another threaded element to apply a varying mechanical force to element 20. For example, a separate threaded portion of subassembly 10 might provide a fixed bearing element with which nut 26 threadedly engages to provide varying force against element 100. It may be further noted that in the illustrated embodiment spring 12 includes one or more slots 14, which may comprise a single spiral slot in certain times. Other spring types might be used in connection with actuators which are tested and/or prepared for service according to the present disclosure, such as tube springs, Belleville springs and the like.

Figure 2:
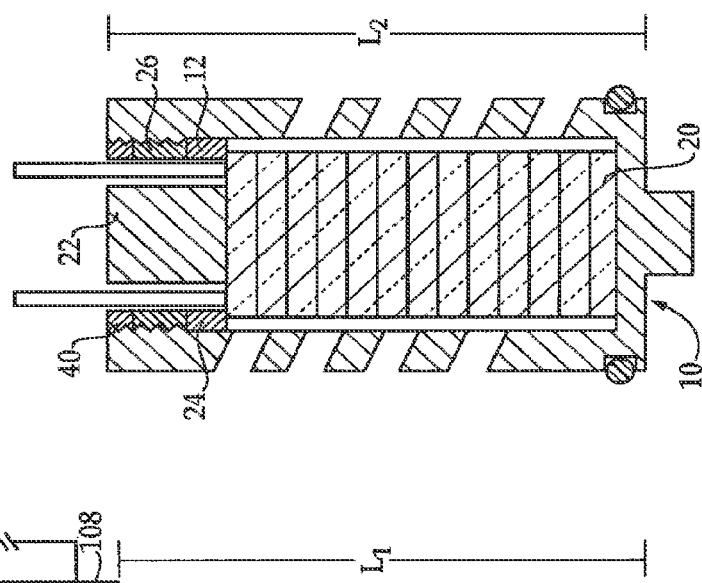
FIG. 2 is a partially sectioned side diagrammatic view of a piezoelectric actuator subassembly, according to one embodiment.

Referring to FIG. 2, there is shown subassembly 10 after having a preload on element 20 set via system 100. It will be noted that nut 26 has been rotated further into spring 12 than in FIG. 1. In FIG. 1, spring 12 has a first length $L_1$, whereas in FIG. 2 spring 12 has a relatively greater length $L_2$, as nut 26 has been used to expand spring 12, drawing it into tension. A lock nut 40 may further be provided which is threaded into spring 12 on top of nut 26 to hold nut 26 at a desired angular orientation or depth within spring 12.

Figure 3:
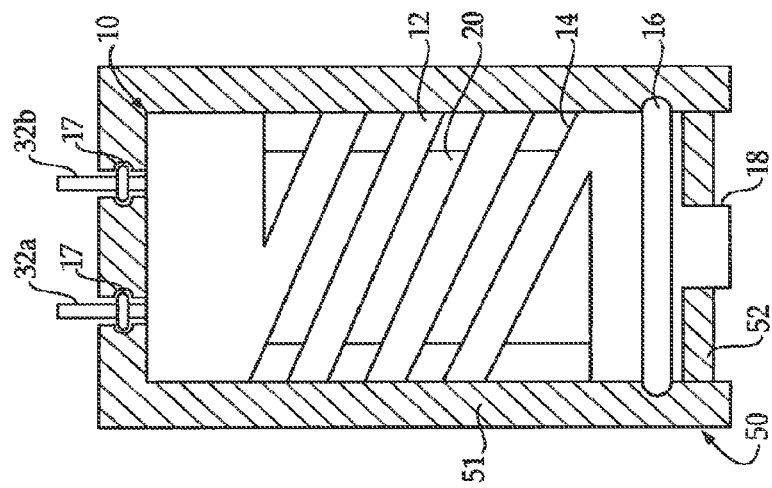
FIG. 3 is a partially sectioned side diagrammatic view of a piezoelectric actuator incorporating the subassembly of FIG. 2.

Turning now to FIG. 3, there is shown subassembly 10 after having been positioned within a casing 51 to create an assembled actuator 50. Casing 51 may substantially surround subassembly 10, and be fluidly sealed relative to spring 12 via seal 16. Additional seals 17, O-rings for example, may be provided to fluidly seal between electrical terminals 32a and 32b and casing 51. A flexible diaphragm 52 may also be provided which is coupled with casing 51 and assists in retaining subassembly 10 therein. Diaphragm 52 may be welded to casing 51, or coupled therewith via any other suitable means.

Figure 5:
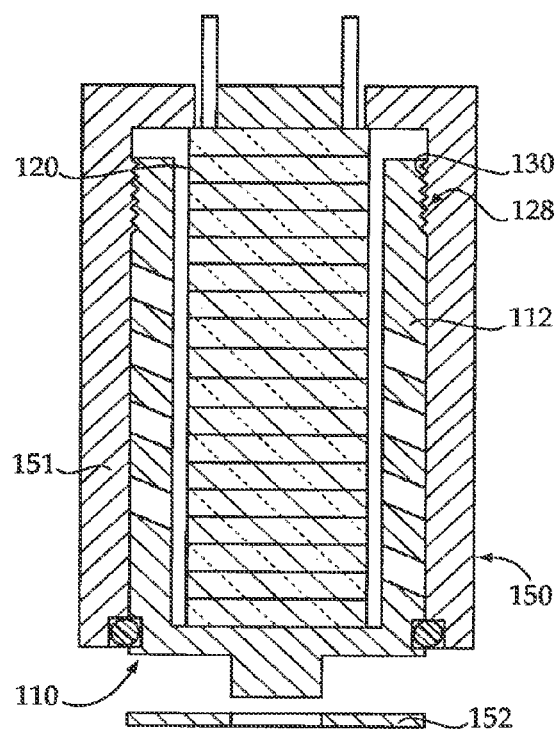
FIG. 5 is a partially sectioned side diagrammatic view of a piezoelectric actuator according to another embodiment.

Turning now to FIG. 5, there is shown another piezoelectric actuator 150 having a casing 151 with a subassembly 110 positioned therein. A diaphragm 152 is also provided which may be coupled with casing 151 in a manner similar to that described with regard to the embodiment of FIG. 3. Subassembly 110 includes a piezoelectric element 120 and a spring 112. Actuator 150 has certain similarities to the foregoing embodiments, but differs with regard to several features. Rather than an internally threaded spring, threadedly coupling with an externally threaded nut, as in the embodiment of FIGS. 1-3, actuator 150 utilizes external threads 128 on spring 112 which threadedly engage with internal threads 130 on casing 151. Preloading of piezoelectric element 120 may be achieved by rotating spring 112 relative to casing 151 to threadedly engage threads 128 and 130, and thereby apply a compressive force on piezoelectric element 120. A preloading system similar to system 100 might be used to prepare actuator 150 for service, albeit rather than rotating a nut, casing 151 may be partially assembled with subassembly 110 and rotated relative thereto to draw spring 112 into tension to preload element 120.

Figure 4:
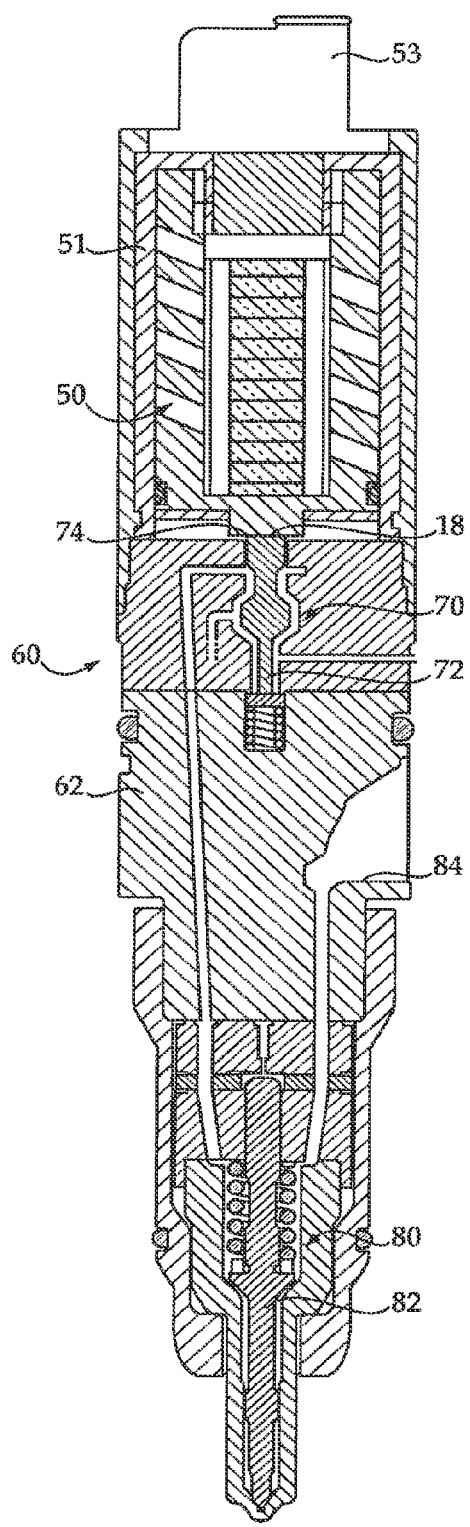
FIG. 4 is a sectioned side diagrammatic view of a fuel injector incorporating the actuator of FIG. 3.

Turning now to FIG. 4, there is shown actuator 50 as it might appear positioned within a fuel injector 60. In the illustrated embodiment, fuel injector 60 includes an injector body 62 having actuator 50 positioned therein. Actuator 50 may comprise a control valve actuator operably coupled with a control valve assembly 70, in particular being configured to adjust the position of a valve member 72 via contact between contact button 18 and an end 74 of valve member 72. Injector 60 may further include a cap 53 coupled with injector body 62 and configured to retain actuator 50 therein. A direct control needle check 80 is also disposed in fuel injector 60, and receives high pressure fuel from an inlet 84, which may be injected from injector 60 via control over the position of a needle 82, as dictated by control valve assembly 70 in a known manner.

INDUSTRIAL APPLICABILITY

As mentioned above, system 100 may be used in preparing a piezoelectrically actuated device for service. In the embodiment described herein, a piezoelectric element such as element 20 may first have a target value established for the electrical property which is to be sensed during setting a preload thereon. Establishing of the target value may take place with system 100 as shown in FIG. 6, or might take place via a separate system. Once the target value is established for a particular piezoelectric element, and assigned to that element, an actuator subassembly such as subassembly 10 may be partially assembled. Partial assembly of subassembly 10 may include placing element 20 within spring 12, inserting spacer 24 into spring 12 such that it contacts element 20, then threading nut 26 into spring 12. An insert 22 may be coupled with the other components of subassembly 10 between or about electrical terminals 32a and 32b. Subassembly 10 may then be placed within and supported with fixture components 102 and 104. Once properly positioned, force producing device 106 may be engaged with nut 26 and sensor 101 connected with electrical terminals 32a and 32b.

System 100 may be used as described above in setting a preload on element 20 at a target preload. Lock nut 40 may then be secured to spring 12 and subassembly 10 removed from system 100. Next, subassembly 10 may be positioned within casing 51, diaphragm 52 attached, and the assembled actuator 50 coupled with injector 60 by placing it within injector body 62 and securing cap 53. Injector 60 is one example of the numerous piezoelectrically actuated devices which can be prepared for service according to the present disclosure. Devices such as control valves in industrial environments, laboratory or other analytical equipment where highly precise positioning actuators are used, certain pneumatic devices and others may benefit from application of the teachings set forth herein.

The present disclosure is contemplated to provide numerous advantages over state of the art strategies for setting and/or testing piezoelectric actuator preload. Certain strategies, such as Frank et al., described above, can result in actuators whose preload varies from a target preload due to variance in the application of the preloading force from mechanical tolerance issues in the preloading equipment. The present disclosure obviates variance relating to tolerances in the preloading equipment, as the electrical property induced by a prescribed preload tends to provide a more precise indication of the magnitude of force being applied than is possible via force feedback control or the like. Moreover, many earlier known systems do not integrate preload testing with any means for adjusting the preload and, at best, provide only a diagnosis that a certain actuator is unsuitable. Thus, the present disclosure may fairly be considered to disclose both testing and setting strategies for preload, used independently or in conjunction with one another. The insight to correlate a sensed electrical property with a magnitude of a mechanical force gives rise to this broad applicability.

The present description is for illustrative purposes only, and should not be construed to narrow the breadth of the present disclosure in any way. Thus, those skilled in the art will appreciate that various modifications might be made to the presently disclosed embodiments without departing from the full and fair scope and spirit of the present disclosure. While much of the present description emphasizes the use of preload testing and setting while making an actuator subassembly, the present disclosure could be implemented to test assembled actuators or even fully assembled piezoelectrically actuated devices. Embodiments are contemplated wherein actuators or actuator parts are preloaded, then passed to a subsequent testing stage to determine if they are appropriately preloaded, or if defects exist which can be revealed by preload testing according to the present disclosure. Actuators could be sorted into one of at least two categories, such as a "pass" category and a "fail" category, based on sensing an electrical property associated with their piezoelectric elements in the manner described herein. Other aspects, features and advantages will be apparent upon an examination of the attached drawings and appended claims.

What is claimed is:

1. A system for preloading piezoelectric actuators comprising:
    a fixture configured to support a piezoelectrically actuated device having an electrical circuit with a piezoelectric element disposed therein;
    a preloading mechanism configured to apply a mechanical force to the piezoelectric element when the piezoelectrically actuated device is supported by the fixture;
    a sensor configured to sense an electrical property induced by the mechanical force in the electrical circuit and output a signal corresponding therewith; and
    a control device coupled with said sensor and configured to receive said signal, wherein said control device is in electronic communication with said preloading mechanism, and further configured to set a preload on said piezoelectric element at a target preload responsive to said signal.

2. The system of claim 1 wherein said control device comprises an electronic control unit configured to compare a value of said signal with a target value.

3. The system of claim 2 wherein said electronic control unit is configured via a closed loop preloading routine to output adjustment commands to said preloading mechanism to set the preload at the target preload based on a plurality of signals from said sensor.

4. The system of claim 3 wherein said preloading mechanism comprises a rotary force producing device having an actuator.

5. A system for preloading piezoelectric actuators comprising:
- a fixture configured to support a piezoelectrically actuated device having an electrical circuit with a piezoelectric element disposed therein;
- a preloading mechanism configured to apply a mechanical force to the piezoelectric element when the piezoelectrically actuated device is supported by the fixture;
- a sensor configured to sense an electrical property induced by the mechanical force in the electrical circuit and output a signal corresponding therewith; and
- a control device coupled with said sensor and configured to adjust said preloading mechanism to set a preload on said piezoelectric element at a target preload based at least in part on said signal;
- wherein said control device comprises an electronic control unit configured to compare a value of said signal with a target value;
- wherein said electronic control unit is configured via a closed loop preloading routine to output adjustment commands to said preloading mechanism to set the preload at the target preload based on a plurality of signals from said sensor;
- wherein said preloading mechanism comprises a rotary force producing device having an actuator; and
- the system further comprising a second force producing device configured to compress said piezoelectric element via a mechanical force having a magnitude equal to the target preload for the piezoelectric element.

* * * * *